United States Patent [19]
Teraguchi

[11] Patent Number: 5,917,196
[45] Date of Patent: Jun. 29, 1999

[54] GROUP III-V TYPE NITRIDE COMPOUND SEMICONDUCTOR LIGHT-EMITTING DEVICE

[75] Inventor: Nobuaki Teraguchi, Nara, Japan

[73] Assignee: Sharp Kabushiki Kaisha, Osaka, Japan

[21] Appl. No.: 08/986,412

[22] Filed: Dec. 8, 1997

[30] Foreign Application Priority Data

Jan. 29, 1997 [JP] Japan .................................. 9-014902

[51] Int. Cl.$^6$ .......................... H01L 29/06; H01L 33/00
[52] U.S. Cl. .................. 257/22; 257/94; 257/103
[58] Field of Search ................. 257/13, 14, 22, 257/94, 103; 372/43, 45

[56] References Cited

FOREIGN PATENT DOCUMENTS 6-177423  6/1994  Japan .

OTHER PUBLICATIONS

Nakamura et al., "InGaN-Based Multi-Quantum-Well-Structure Laser Diodes" *Jpn. J. Appl. Phys.* (1996) 35:L74–L76.

*Primary Examiner*—Minh Loan Tran
*Attorney, Agent, or Firm*—Morrison & Foerster LLP

[57] ABSTRACT

A group III-V type nitride compound semiconductor light-emitting device employing compound semiconductors the lattices of which are matched to each other and having a large band discontinuity value between the semiconductor layers is characterized in that it is a light-emitting device obtained by junction of a barrier layer and an active layer and that the active layer contains Nb. The present invention provides a group III-V type nitride compound semiconductor light-emitting device which has low threshold current and low threshold voltage characteristics.

8 Claims, 4 Drawing Sheets

GROUP III-V TYPE NITRIDE COMPOUND SEMICONDUCTOR LIGHT-EMITTING DEVICE

BACKGROUND OF THE INVENTION

1. Field of the Invention

The present invention relates to a group III–V type nitride compound semiconductor light-emitting device, and particularly to a group III–V type nitride compound semiconductor light-emitting device with blue or green band-edge emission.

2. Description of the Background Art

Heretofore, AlN, GaN and InN and especially AlGaN and GaInN of ternary system have been considered as materials used for a group III–V type nitride compound semiconductor light-emitting device. In particular, Japanese Patent Laying-Open No. 6-177423 discloses that a p-type AlGaN layer and an n-type GaInN layer are used to implement a blue LED or green LED.

Furthermore, "InGaN-Based Multi-Quantum-Well-Structure Laser Diodes", S. Nakamura et al., Jap. J. Appl. Phys. vol. 35 (1996) pp. L74–L76 describes a semiconductor laser device in which an AlGaN/InGaN-based laser with $Ga_{0.8}In_{0.2}N/Ga_{0.95}In_{0.05}N$ multi-quantum well structure with 26 periods of quantum wells as an active layer is employed to achieve pulse operation at room temperature.

For LED which employs the combination of p-type AlGaN and n-type GaInN described above, the emission caused by the impurity level in GaInN is used to obtain blue or green emission. However, the emission caused by impurity level cannot achieve lasing when, as is in laser, high level injection of carrier is used, since band-edge emission is dominant. Furthermore, increasing a bandgap difference disadvantageously increases lattice mismatch.

For a laser which employs GaInN band-edge emission, the band discontinuity between a well layer of a quantum well structure and a barrier layer cannot be a sufficiently large due to the level in lattice mismatch between the well layer and the barrier layer, and the number of wells is thus considerably increased to 26 to confine the carriers. However, increasing the number of wells increases the width of an undoped active layer, and this extraordinary increases the value of threshold voltage and also results in increased lattice distortion in the active layer. Thus, while it is preferable that lasing can be obtained with a smaller number of wells, this requires an increased band discontinuity between a well layer and a barrier layer and selection of materials with a small lattice mismatches.

For an AlGaN presently used, the value of Al composition is a maximum of approximately 20%, and for that value the bandgap is approximately 3.87 eV and the lattice constant is 3.17 Å. For an InGaN presently used, the value of In composition is approximately 15%, and for that value the bandgap is approximately 3.05 eV and the lattice constant is 3.24 Å. The lattice mismatch therebetween is thus 2.2%.

FIG. 7 shows the relation between the lattice constant of a-axis and bandgap of a GaN-based semiconductor which contains Al or In. As is apparent from FIG. 7, as the bandgap difference between AlGaN and InGaN is increased, the lattice mismatch is also increased. It is thus impossible for the combination of AlGaN and InGaN to achieve a lattice mismatch of 0% and a large bandgap. In other words, for conventional AlGaInN-based semiconductors to increase the band discontinuity value between AlGaN and InGaN, the compositions of Al and In are increased and thus much more remarkable lattice mismatch results. It has thus been difficult for AlGaN/InGaN-based semiconductors to achieve lasing in the range from blue to green.

SUMMARY OF THE INVENTION

The present invention contemplates a group III–V type nitride compound semiconductor light-emitting device employing compound semiconductors the lattices of which are matched to each other and having a large band discontinuity value between semiconductor layers thereof.

According to one aspect of the present invention, a group III–V type nitride compound semiconductor light-emitting device is obtained by junction of a barrier layer and an active layer which is characterized in that it contains Nb.

FIG. 7 shows a relation between bandgap and lattice constant of a-axis of AlN, GaN, InN and NbN in the hexagonal system. As shown in FIG. 7, a straight line cannot be drawn between GaN and NbN, and any detailed correlation therebetween has not been obtained. The circles shown in the figure represent a relation between lattice constant and bandgap of a semiconductor of AlGaInNbN obtained in an embodiment described hereinafter.

When Nb, which has been found as a new constituting element, is now used and added, for example, to GaN, the resultant GaNbN is superior in that it acts to be lattice matched to AlGaN and also be able to increase the band discontinuity value between GaNbN and AlGaN, and the embodiments of the present invention described hereinafter are all obtained by application of this phenomenon.

In the present invention, a combination of a barrier layer and an active layer can be that of a barrier layer of AlGaN and an active layer of AlGaNbN, for example. In this example, the composition ratio of Nb to AlGaNbN is preferably no more than 10%.

Another exemplary combination of a barrier layer and an active layer can be that of a barrier layer of AlGaN and an active layer of AlGaInNbN. In this example, a quantum well structure of AlGaInNbN and AlGaN can be applied to the active layer. The composition ratio of Nb to AlGaInNbN is preferably no more than 10%.

Still another exemplary combination of a barrier layer and an active layer can be that of a barrier layer of GaN and an active layer of GaInNbN. In this example, the composition ratio of Nb to GaInNbN is preferably no more than 10%.

In the present invention, any limitation is not placed on the amount of Nb added with respect to crystal structure. However, when ultraviolet to green is considered as a laser operation wavelength, the composition ratio of Nb is preferably no more than 10% due to bandgap (approximately 2.4 eV as the bandgap of the active layer), since addition of Nb allows the bandgap to rapidly decrease rather than linearly change. This characteristic is taken into consideration in the embodiments of the present invention and the Nb composition is thus no more than 10%.

According to the present invention, semiconductor layers of multi-layered group III–V type nitride compound semiconductors can have a large band discontinuity therebetween and also have lattice match. This allows a group III–V type nitride compound semiconductor light-emitting device with low threshold current and low threshold voltage characteristics.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
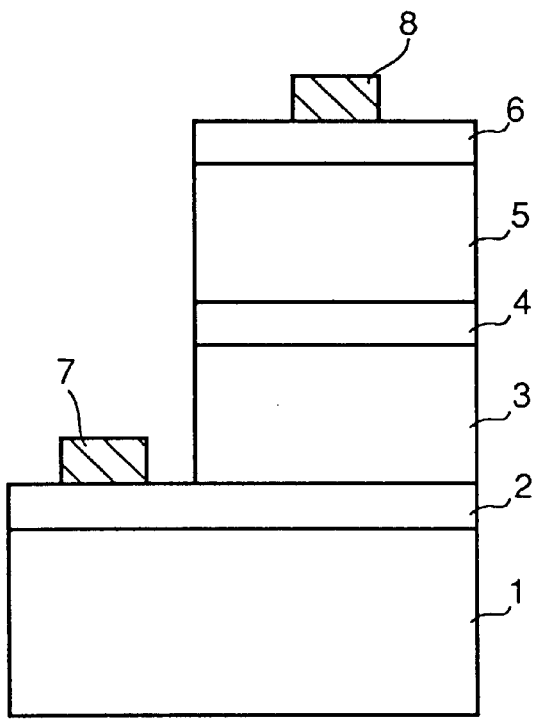
FIG. 1 shows a multi-layered structure of a blue light-emitting device according to a first embodiment.

FIG. 1 is a cross section of the structure of a blue light-emitting device as one example of a group III–V type nitride compound semiconductor light-emitting device according to the present invention. The blue light-emitting device employs a barrier layer of $Al_{0.2}Ga_{0.8}N$ and an active layer of $Al_{0.1}Ga0.88Nb_{0.02}N$. The barrier and active layers are both grown by the MBE method at a substrate temperature of 800° C. Knudsen cell is used for Al and Ga, electron beam gun for Nb, and RF radical cell for N.

Referring to FIG. 1, successively grown on a $LiAlO_2$ substrate 1 are an n-type GaN contact layer 2 (layer thickness: 0.1 μm, carrier concentration: $1\times10^{18}cm^{-3}$), an n-type $Al_{0.2}Ga_{0.8}N$ barrier layer 3 (layer thickness: 1.0 μm, carrier concentration: $5\times10^{17}cm^{-3}$), an i-type $Al_{0.1}Ga_{0.88}Nb_{0.02}N$ active layer 4 (layer thickness: 20 nm), a p-type $Al0.2Ga0.8N$ barrier layer 5 (layer thickness: 0.8 μm, carrier concentration: $5\times10^{17}cm^{-3}$), and a p-type GaN contact layer 6 (layer thickness: 0.2 μm, carrier concentration: $2\times10^{18}cm^{-3}$).

Then, an n-type electrode 7 and a p-type electrode 8 are formed on a contact layer 2 and a contact layer 6, respectively.

The multi-layered structure thus formed was cleaved through the cleavage of $LiAlO_2$ substrate 1 to fabricate a laser device. The blue light-emitting device fabricated has a cavity length of 1 mm and a stripe width of the p-type electrode of 10 μm.

Figure 2:
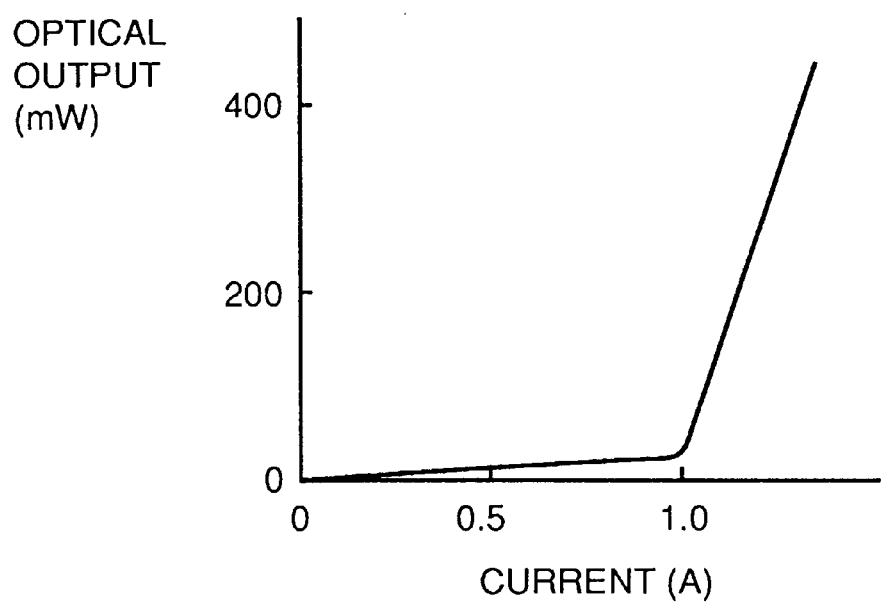
FIG. 2 represents the current-optical output characteristic of the blue light-emitting device of the first embodiment.

FIG. 2 shows the current-optical output characteristic of the CW operated light-emitting device according to the present embodiment at room temperature. Referring to FIG. 2, it is found that the light-emitting device starts lasing when the current reaches 1A. The threshold voltage of the blue light-emitting device was 10V, which was a rather smaller value than 34V for a conventional InGaN multi-quantum well structure. The laser operation wavelength was 430 nm.

P-type $Al_{0.2}Ga_{0.8}N$ barrier layer 5 had a bandgap of approximately 3.87 eV and a lattice constant of 3.17 Å. $Al_{0.1}Ga_{0.88}Nb_{0.02}N$ active layer 4 had a lattice constant of 3.169 Å and thus was almost lattice matched to p-type $Al_{02}Ga_{0.8}N$ barrier layer 5. Furthermore, the bandgap was approximately 2.8 eV, which results in a bandgap difference larger than when an $In_{0.15}Ga_{0.85}N$ active layer is used.

Second Embodiment

Figure 3:
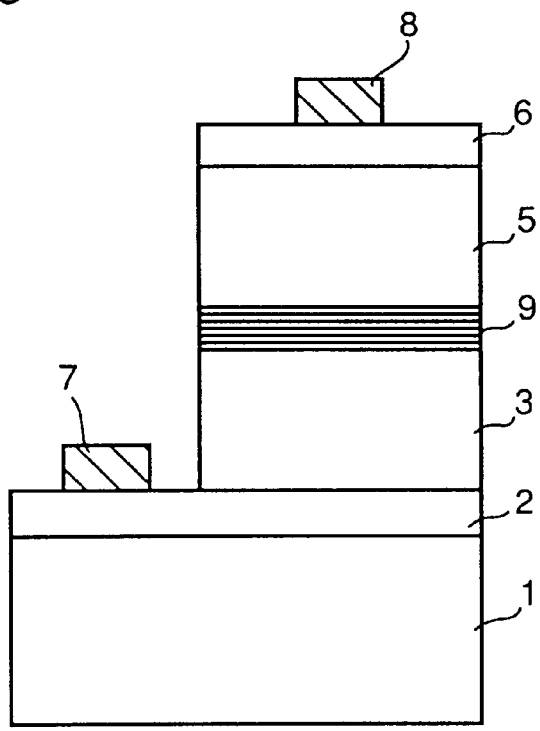
FIG. 3 shows a multi-layered structure of a blue green light-emitting device according to a second embodiment.

FIG. 3 shows a cross section of the structure of a blue-green light-emitting device as another example of a group III–V type nitride compound semiconductor light-emitting device according to the present invention. In the blue-green light-emitting device, $Al_{0.2}Ga_{0.8}N$ is employed for a barrier layer and an $Al_{0.1}Ga_{0.85}In_{0.03}Nb_{0.02}N$ (lattice constant: 3.174 Å)/$Al_{0.1}Ga_{0.9}N$ triple quantum well structure is employed for an active layer. The barrier and active layers are both grown by the MBE method at a substrate temperature of 800° C. Knudsen cell is used for Al, Ga and In, electron beam gun for Nb, and RF radical cell for N.

Referring first to FIG. 3, successively grown on $LiAlO_2$ substrate 1 are n-type GaN contact layer 2 (layer thickness: 0.1 μm, carrier concentration: $1\times10^{18}cm^{-3}$), n-type $Al_{0.2}Ga_{0.8}N$ barrier layer 3 (layer thickness: 1.0 μm, carrier concentration: $5\times10^{17}cm^{-3}$), an i-type $Al_{0.1}Ga_{0.85}In_{0.03}Nb_{0.02}N/Al_{0.1}Ga_{0.9}N$ triple-quantum-well active layer 9 (having a structure formed of alternately layered films of 5 nm and 10 nm in thickness, p-type $Al_{0.2}Ga0.8N$ barrier layer 5 (layer thickness: 0.8 μm, carrier concentration: $5\times10^{17}cm^{-3}$), and p-type GaN contact layer 6 (layer thickness: 0.2 μm, carrier concentration: $2\times10^{18}cm^{-3}$). Then, n- and p-type electrodes 7 and 8 are formed on contact layers 2 and 6, respectively.

The multi-layered structure thus formed was cleaved through the cleavage of $LiAlO_2$ substrate 1 to fabricate a laser device. The blue-green light-emitting device fabricated had a cavity length of 1 mm and a stripe width of the p-type electrode of 10 μm.

Figure 4:
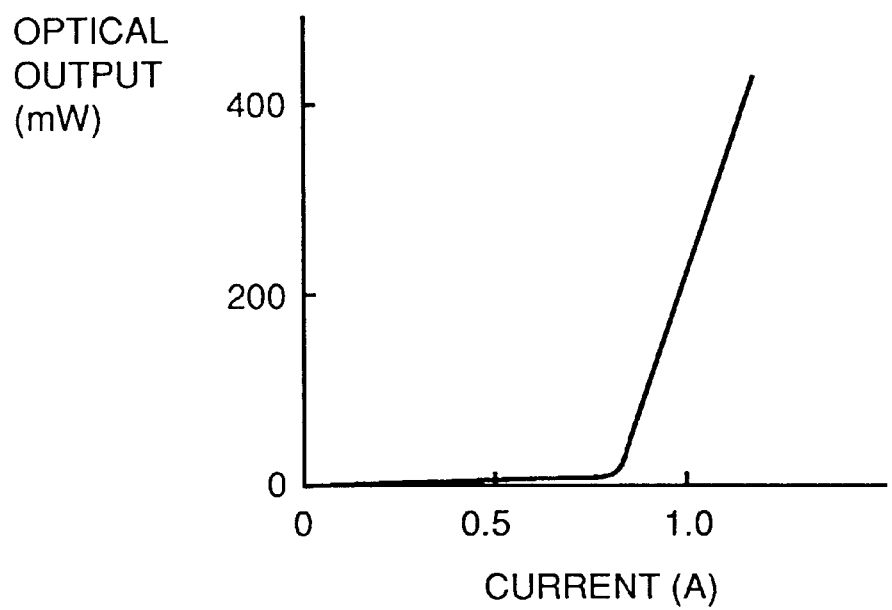
FIG. 4 shows the current-optical output characteristic of the blue green light-emitting device according to the second embodiment.

FIG. 4 shows the current-output characteristic of the CW operated blue-green light-emitting device according to the present embodiment at room temperature.

Referring to FIG. 4, it is found that the light-emitting device starts lasing when the current reaches 0.8 Å. The threshold voltage of the blue-green light-emitting device was 8V, which was rather a smaller value than the threshold voltage of a light-emitting device which employs a conventional multi-quantum well structure of InGaN, 34V. The laser operation wavelength was 470 nm.

Third Embodiment

Figure 5:
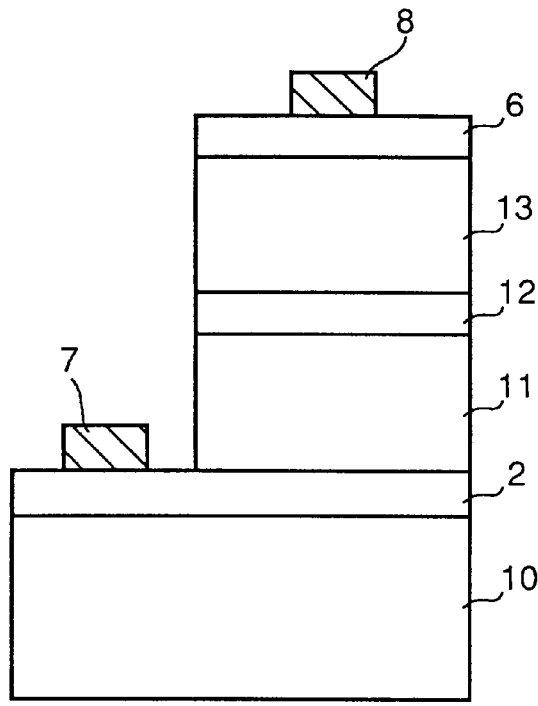
FIG. 5 shows a multi-layered structure of a green light-emitting device according to a third embodiment.

FIG. 5 shows a cross section of the structure of a green light-emitting device as still another example of the group III–V type nitride compound semiconductor light-emitting device according to the present invention which employs a barrier layer of GaN and an active layer of $Ga_{0.9}In_{0.05}Nb_{0.05}N$ (lattice constant: 3.188 Å). The barrier and active layers were both grown by the MBE method at a substrate temperature of 700° C. Knudsen cell was used for Ga and In, electron beam gun for Nb, and RF radical cell for N.

Referring first to FIG. 5, successively grown on a $LiGaO_2$ substrate 10 are n-type GaN contact layer 2 (layer thickness: 0.1 μm, carrier concentration: $1\times10^{18}cm^{-3}$), an n-type GaN barrier layer 11 (layer thickness: 1.0 μm, carrier concentration: $5\times10^{17}cm^{-3}$), an i-type $Ga_{0.9}In_{0.07}Nb_{0.03}N$ active layer 12 (layer thickness: 10 nm), a p-type GaN barrier layer 13 (layer thickness: 0.8 μm, carrier concentration: $5\times10^{17}cm^{-3}$), and p-type GaN contact layer 6 (layer thickness: 0.2 μm, carrier concentration: $2\times10^{18}cm^{-3}$).

Then, n- and p-type electrodes 7 and 8 are formed on contact layers 2 and 6, respectively.

The multi-layered structure thus formed is cleaved through the cleavage of $LiGaO_2$ substrate 10 to fabricate a green light-emitting device. The green light-emitting device thus fabricated had a cavity length of 1 mm and a stripe width of the p-type electrode of 10 μm.

Figure 6:
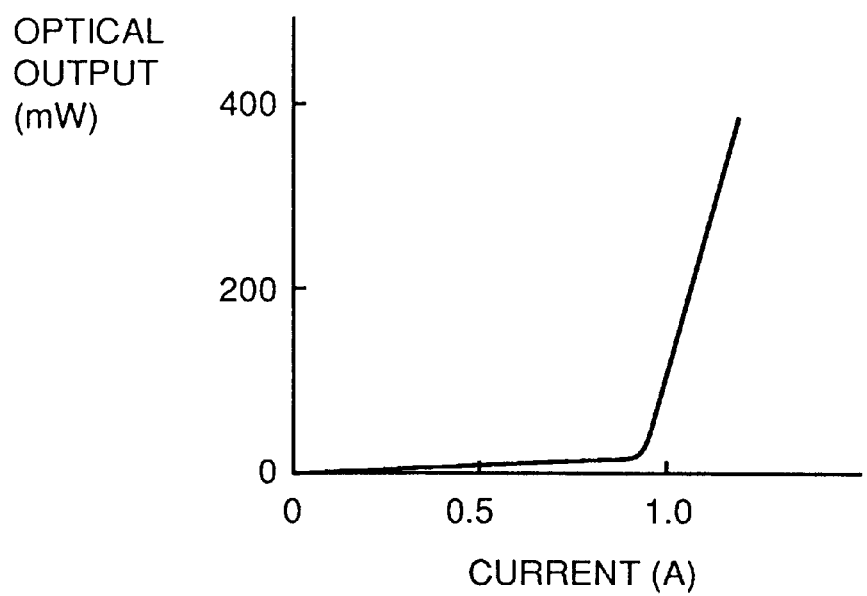
FIG. 6 shows the current-optical output characteristic of the green light-emitting device according to the third embodiment.
Figure 7:
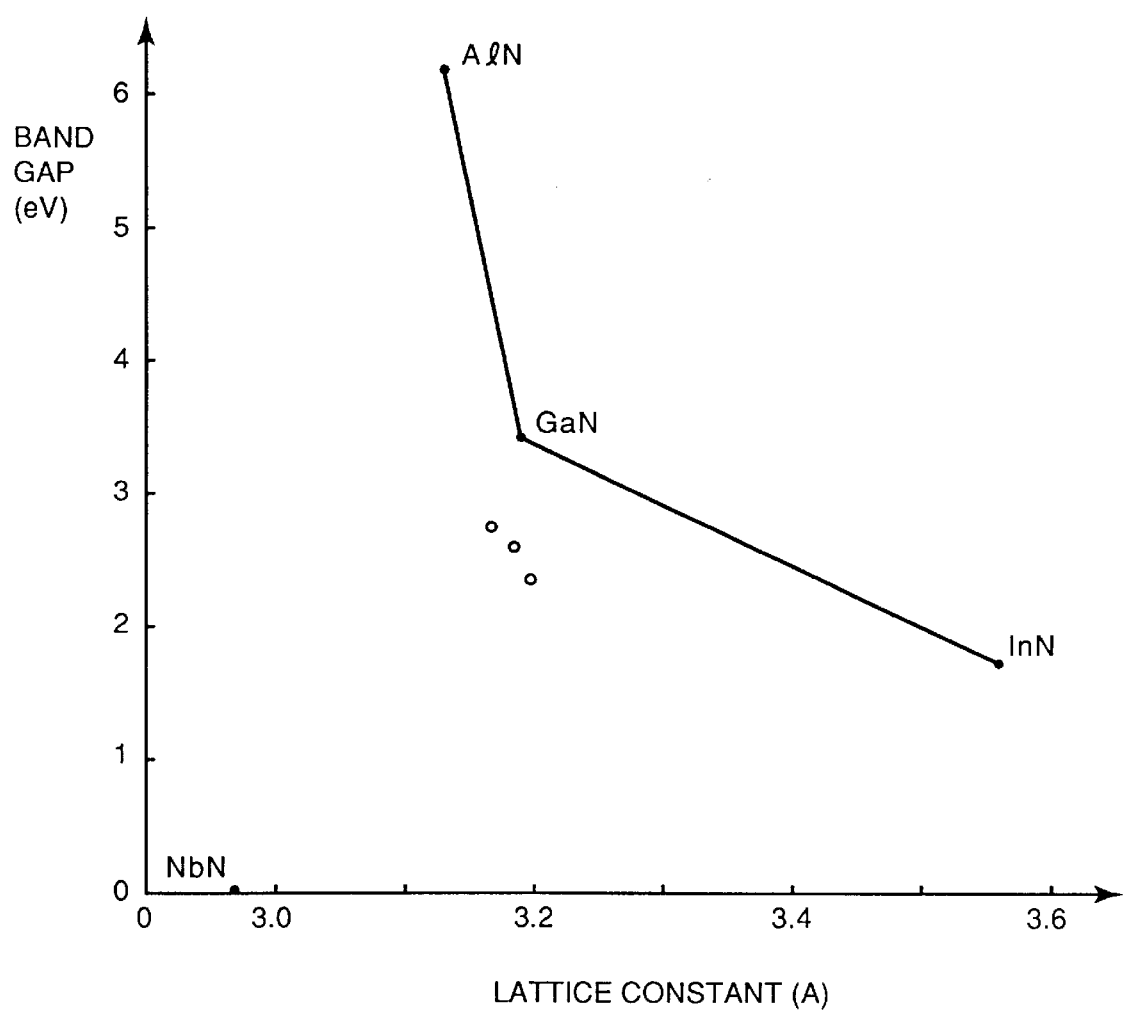
FIG. 7 shows the relation between the bandgap and lattice constant of a-axis of nitride semiconductors.

FIG. 6 shows the current-optical output characteristic of the CW operated green light-emitting device according to the present embodiment at room temperature. Referring to FIG. 6, it is found that the light-emitting device starts lasing when the current reaches 0.8A. The threshold voltage of the device was 9V, which is rather a smaller value than 34V for InGaN multi-quantum well. The laser operation wavelength was 510 nm.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A group III–V type nitride compound semiconductor light-emitting device is obtained by junction of a barrier layer and an active layer, characterized in that said active layer contains Nb.

2. The group III–V type nitride compound semiconductor light-emitting device according to claim 1, characterized in that said barrier layer is formed of AlGaN and said active layer is formed of AlGaNbN.

3. The group III–V type nitride compound semiconductor light-emitting device according to claim 2, wherein a composition ratio of said Nb to said AlGaNbN is no more than 10%.

4. The group III–V type nitride compound semiconductor light-emitting device according to claim 1, characterized in that said barrier layer is formed of AlGaN and said active layer is formed of AlGaInNbN.

5. The group III–V type nitride compound semiconductor light-emitting device according to claim 4, characterized in that said active layer has a quantum well structure of AlGaInNbN/AlGaN.

6. The group III–V type nitride compound semiconductor light-emitting device according to claim 5, wherein a composition ratio of said Nb to said AlGaInNbN is no more than 10%.

7. The group III–V type nitride compound semiconductor light-emitting device according to claim 1, characterized in that said barrier layer is formed of GaN and said active layer is formed of GaInNbN.

8. The group III–V type nitride compound semiconductor light-emitting device according to claim 7, wherein a composition ratio of said Nb to said GaInNbN is no more than 10%.

* * * * *